(12) United States Patent
Thul

(10) Patent No.: US 9,772,663 B2
(45) Date of Patent: Sep. 26, 2017

(54) SYSTEM AND METHOD FOR DISTRIBUTING POWER TO RACK MOUNTED SERVERS

(71) Applicant: LiThul LLC, Phoenix, AZ (US)

(72) Inventor: Theodore M. Thul, Phoenix, AZ (US)

(73) Assignee: Lithul LLC, Phoenix, AZ (US)

(*) Notice: Subject to any disclaimer, the term of this patent is extended or adjusted under 35 U.S.C. 154(b) by 2 days.

(21) Appl. No.: 14/884,593

(22) Filed: Oct. 15, 2015

(65) Prior Publication Data

US 2017/0108899 A1 Apr. 20, 2017

(51) Int. Cl.
H05K 7/14 (2006.01)
H05K 7/18 (2006.01)
G06F 1/18 (2006.01)

(52) U.S. Cl.
CPC ........... *G06F 1/189* (2013.01); *H05K 7/1457* (2013.01); *H05K 7/1492* (2013.01)

(58) Field of Classification Search
CPC ..... H05K 7/1457; H05K 7/1492; G06F 1/189
See application file for complete search history.

(56) References Cited

U.S. PATENT DOCUMENTS

| | | | |
|---|---|---|---|
| 4,972,296 A | 11/1990 | Chu | |
| 5,114,360 A | 5/1992 | Steinhardt | |
| 5,148,353 A | 9/1992 | Morgan | |
| 5,253,140 A * | 10/1993 | Inoue | H05K 7/1468 16/429 |
| 5,431,573 A | 7/1995 | Endo | |
| 5,486,982 A | 1/1996 | Hsu | |
| 5,697,806 A | 12/1997 | Whiteman, Jr. | |
| 6,083,027 A | 7/2000 | Sato | |
| 6,086,397 A | 7/2000 | Chapman | |
| 6,229,691 B1 * | 5/2001 | Tanzer | H01R 25/006 361/610 |
| 6,358,080 B1 | 3/2002 | Conorich | |
| 6,676,430 B1 | 1/2004 | Conorich | |
| 6,741,442 B1 | 5/2004 | McNally | |
| 6,882,530 B2 | 4/2005 | Cyphers | |
| 7,196,900 B2 | 3/2007 | Ewing | |
| 7,293,666 B2 | 11/2007 | Mattlin | |
| 7,457,106 B2 | 11/2008 | Ewing | |
| 7,542,268 B2 | 6/2009 | Johnson, Jr. | |
| 7,826,232 B2 | 11/2010 | Von Arx | |
| 7,857,214 B2 | 12/2010 | Saliaris | |
| 7,893,567 B1 | 2/2011 | Deros | |
| 8,305,737 B2 | 11/2012 | Ewing et al. | |
| 8,321,163 B2 | 11/2012 | Ewing et al. | |
| 8,448,592 B2 | 5/2013 | Crowell et al. | |

(Continued)

*Primary Examiner* — Robert J Hoffberg
(74) *Attorney, Agent, or Firm* — Jennings, Strouss & Salmon, PLC

(57) ABSTRACT

A power distribution system for use with rack mounter computer devices includes a cabinet and a PDU. The cabinet includes: a rack region having a plurality of rail pairs for supporting a plurality of computer devices; a bus region having a base mount support and a server connector module; and a PDU configured for receipt within the bus region. The PDU includes: a plurality of electrical outlets configured to supply power to the computing devices; a PDU connector configured for releasable engagement with the server connector module; and a base mount configured to permit the PDU to pivot about the base mount support.

18 Claims, 12 Drawing Sheets

(56) References Cited

U.S. PATENT DOCUMENTS

| | | |
|---|---|---|
| 8,489,667 B2 | 7/2013 | Ewing |
| 8,494,661 B2 | 7/2013 | Ewing et al. |
| 8,510,424 B2 | 8/2013 | Ewing et al. |
| 8,527,619 B2 | 9/2013 | Ewing et al. |
| 8,541,906 B2 | 9/2013 | Ewing et al. |
| 8,541,907 B2 | 9/2013 | Ewing et al. |
| 8,549,062 B2 | 10/2013 | Ewing et al. |
| 8,549,067 B2 | 10/2013 | Ewing et al. |
| 8,560,652 B2 | 10/2013 | Ewing et al. |
| 8,587,950 B2 | 11/2013 | Ewing et al. |
| 8,601,291 B2 | 12/2013 | Ewing et al. |
| 8,694,272 B2 | 4/2014 | Ewing et al. |
| 8,730,695 B1 | 5/2014 | Ludlam et al. |
| 8,797,751 B2 | 8/2014 | Peng |
| 8,935,011 B2 | 1/2015 | Tischer |
| 9,009,288 B2 | 4/2015 | Ewing et al. |
| 9,030,810 B2 * | 5/2015 | Ehlen ............... H05K 7/1432 |
| | | 361/622 |
| 9,065,195 B2 | 6/2015 | Wallner |
| 9,104,393 B2 | 8/2015 | Ewing et al. |
| 9,142,971 B2 | 9/2015 | Ewing |
| 9,166,382 B2 | 10/2015 | Ewing |
| 9,425,566 B2 | 8/2016 | Lee |
| 9,438,017 B2 | 9/2016 | Irons |
| 9,444,263 B2 | 9/2016 | Garcia Sosa |
| 9,466,954 B1 | 10/2016 | Stevens |
| 9,532,479 B2 | 12/2016 | Hamada |
| 9,537,260 B1 | 1/2017 | Chen |
| 9,543,720 B2 * | 1/2017 | Chen ................ H01R 25/006 |
| 2001/0026436 A1 * | 10/2001 | Tanzer ............... H01R 25/006 |
| | | 361/610 |
| 2005/0101193 A1 | 5/2005 | Godard |
| 2006/0071779 A1 | 4/2006 | Renkis |
| 2006/0199438 A1 | 9/2006 | Cleveland |
| 2009/0234512 A1 | 9/2009 | Ewing |
| 2009/0236909 A1 | 9/2009 | Aldag |
| 2010/0163279 A1 | 7/2010 | Ho |
| 2010/0328849 A1 | 12/2010 | Ewing |
| 2011/0218689 A1 | 9/2011 | Chan |
| 2013/0294014 A1 | 11/2013 | Irons |
| 2014/0057626 A1 | 2/2014 | Uelk |
| 2014/0070679 A1 | 3/2014 | Liang |
| 2014/0085790 A1 | 3/2014 | Fan |
| 2014/0144670 A1 | 5/2014 | Irons |
| 2015/0177797 A1 * | 6/2015 | Butzer ................ G06F 1/26 |
| | | 713/300 |
| 2015/0236512 A1 | 8/2015 | Whitney |
| 2015/0280379 A1 * | 10/2015 | Yan ................ H05K 7/1457 |
| | | 439/224 |

* cited by examiner

SYSTEM AND METHOD FOR DISTRIBUTING POWER TO RACK MOUNTED SERVERS

FIELD OF INVENTION

The present invention generally relates to systems and methods for supplying power to rack mounted servers and, more particularly, to an improved server rack frame architecture having an integrated power bus.

BACKGROUND

Power distribution units (PDUs) are elongated devices equipped with multiple electrical outlets for distributing power to racks of computers and networking equipment. Rack mounted strips facilitate power filtering, intelligent load balancing, and remote monitoring and control via local area network (LAN) or simple network management protocols (SNMPs).

In a typical server rack installation, a vertically oriented PDU is disposed along a side edge of the rack, with power to the PDU provided through a power cord extending from an uninterruptable power supply (UPS). As the component density of server installations and data centers increases, these power cords present increasing logistical complexity to the network manager, both from the standpoint of initial installation as well as component replacement. Moreover, the resulting cable connections can be visually unpleasing and cumbersome.

A system is thus needed which overcomes these and other shortcomings associated with prior art server rack power distribution techniques.

SUMMARY OF THE INVENTION

An improved server rack architecture provides an integrated power distribution bus removably housed within the server rack frame. In various embodiments, the rack system includes a chassis which houses servers and networking equipment in a traditional server rack mounting configuration, as well as an extended chassis configured to house a modified or enhanced PDU. In this context, the term "enhanced PDU" refers to a PDU with the power cord replaced by an integral PDU connector mount module.

The extended chassis includes a server side connector module configured to mechanically and electrically mate with the PDU connector mount module to thereby supply power to the PDU upon "snap in" installation. To facilitate installing the enhanced PDU, the extended chassis may include a pivot mechanism for guiding the PDU connector mount module into manual engagement with the server side connector module. In this way, the enhanced PDU is effectively integrated into the chassis as a plug-n-play power bus.

Power may be supplied from a traditional UPS to the server side connector module in any convenient manner, such as running power cables through ceiling or flooring conduit.

BRIEF DESCRIPTION OF THE DRAWING FIGURES

The present invention will hereinafter be described in conjunction with the appended drawing figures, wherein like numerals denote like elements, and:

DETAILED DESCRIPTION OF PREFERRED EXEMPLARY EMBODIMENTS

Various embodiments of the present invention relate to an improved server rack assembly including an integrated power distribution system. The server rack frame includes a first region configured to support a plurality of network computing components (e.g., servers, routers) having a standard width dimension. The frame also includes one or more extended regions configured to house a manually removable power supply. In contrast to prior art PDUs, PDUs of the present invention include a docking mechanism for mechanically and electrically mating with a power source affixed to the frame, and a guide mechanism (e.g., a pivot) for facilitating the manual installation and removal of the PDU from the server frame.

Figure 1:
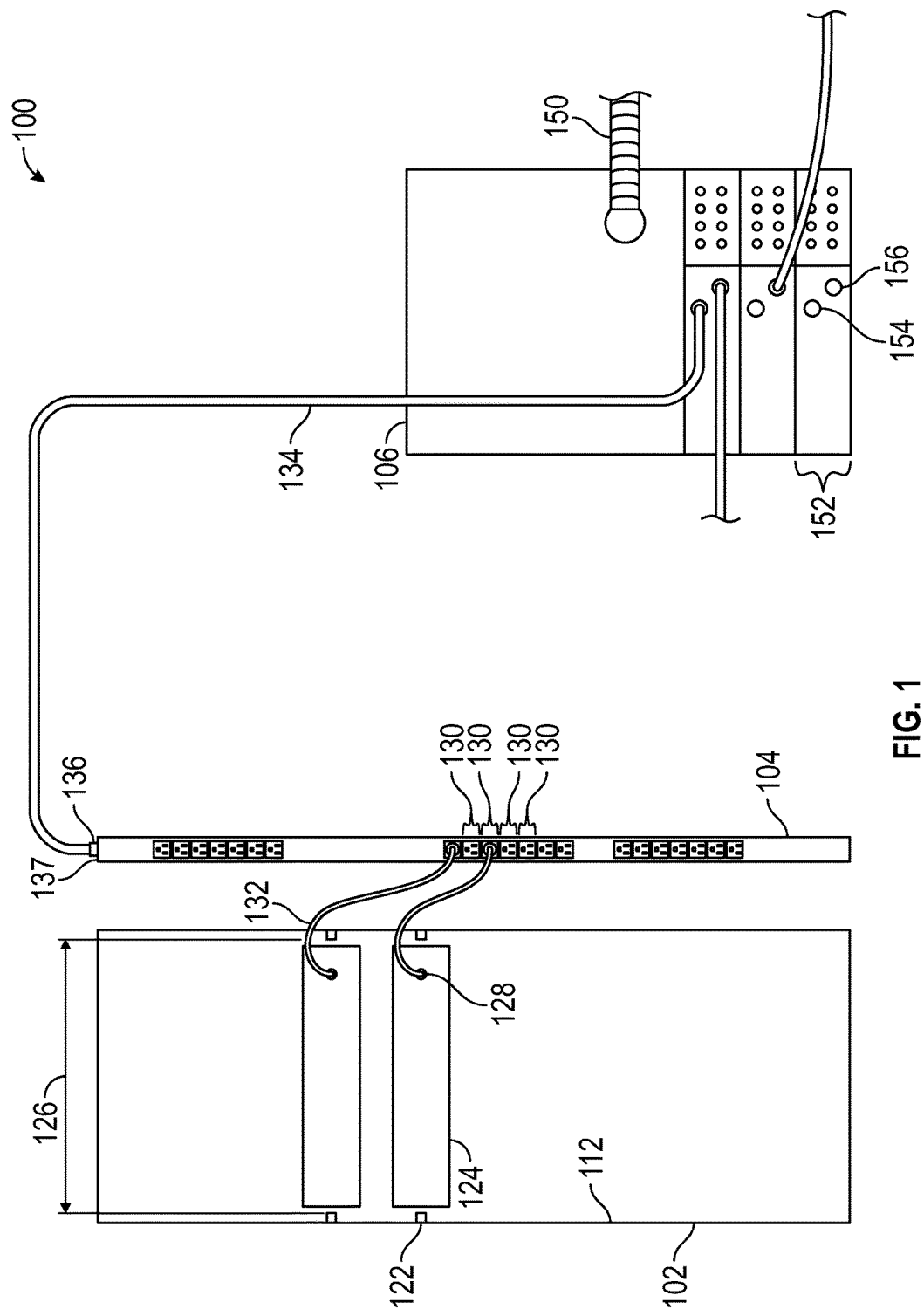
FIG. 1 is a schematic diagram of a prior art system for supplying power to rack mounted servers.

Referring now to FIG. 1, a prior art power distribution system 100 includes a server rack 102, a PDU 104, and a power supply 106. The server rack 102 includes a plurality of rails 122 for (e.g., slidably) mounting respective servers 124, with the rails 122 being secured to or integrated into oppositely disposed interior panels 112 and separated by a nominal distance 126 generally corresponding to the width of servers 124. In this context, the term "rail" refers to any mechanism or technique for securing a hardware component within the server rack such as screws, bolts, quick release mechanisms, fasteners, or the like. Power is supplied from the PDU 104 to each server 124 at a power connection 128.

More particularly, the PDU 124 may comprise any suitable power strip, PDU, or other device available from, for example, Data Center Resources, the American Power Conversion (APC) Corporation, ServerTech, and Global Industrial. A typical PDU 104 may include an elongated rectangular metal housing with a plurality of female electrical outlets 130 extending along a front surface, and a power cord 134 terminating at a rubber or plastic grommet 136 or other suitable connection proximate a top end 137 of the PDU. Although not shown in FIG. 1, many PDUs also include various ports for facilitating network connectivity, monitoring, and control such as, for example, wide area network (WAN), local area network (LAN), and Ethernet protocols. The power cord 134 supplies power to the PDU from the power supply 106, as described in more detail below.

The power supply 106 may be any suitable power source such as a data center compatible uninterruptible power supply (UPS) available form, for example, Emerson Network Power, APC, and ServerTech. A typical power supply 106 may include an input power cable 150 (source power), and a plurality of output power modules 152, each having a "Phase A" output terminal 154 and a "Phase B" output terminal 156. In the illustrated embodiment, the power cord 134 supplies power to the PDU from the "Phase A" output terminal 154.

With continued reference to FIG. 1, in presently known installations PDUs are associated with server racks on an ad hoc basis, often being secured to the cabinet with zip ties, electrical tape, or simple placed in an unsecured manner between adjacent cabinets. Consequently, power cords extending from the UPS to the various PDUs often impede human access, impose visual clutter, and otherwise increase entropy within the server rack environment. Improved power distribution systems, arrangements, components, and methodologies are thus needed which overcome these limitations.

Figure 2:
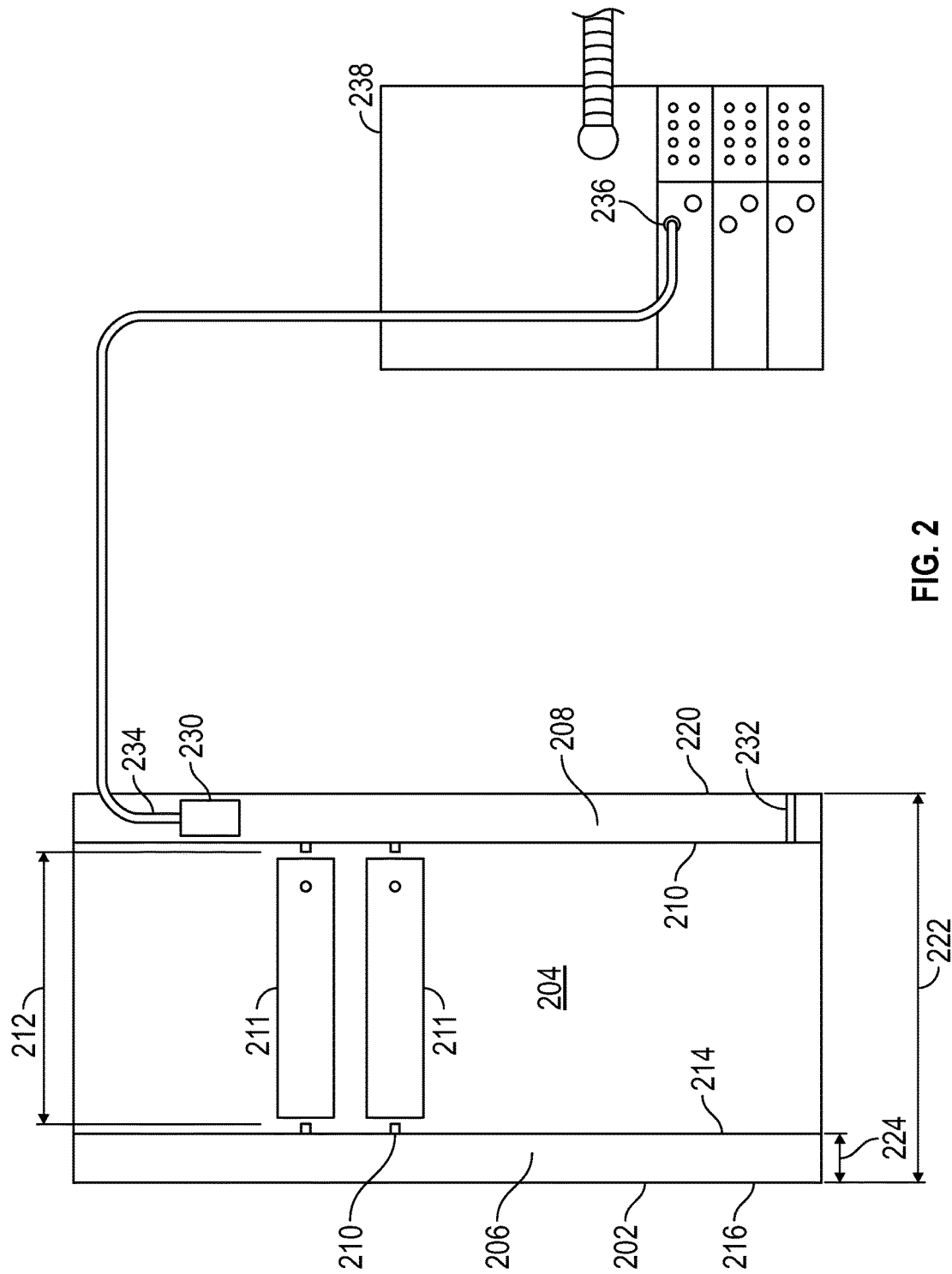
FIG. 2 is a schematic diagram of an improved system including a server rack having an extended width chassis for accommodating a cordless PDU in accordance with various embodiments.

FIG. 2 is a schematic diagram of an improved system including a server rack having an extended width chassis for accommodating a cordless PDU in accordance with various embodiments. In this context, the term "cordless" refers to a PDU according to the present invention that is configured to receive power from an external power supply via a connection module that is integral with the PDU, as opposed to traditional prior art PDUs which receive power from an external power supply via a flexible power cord. Alternatively, the term "cordless" refers to a component which lacks an external flexible electrical cord. More particularly, a rear elevation view of a server cabinet 202 illustrates an internal rack region 204 defined by a left wall panel 214 and a right wall panel 218, each bearing a plurality of rails 210 configured to support server hardware components 211. For purposes of this discussion, the nominal width 212 of the internal rack region 204 corresponds to the distance between the left and right rails 210, which generally corresponds to the nominal width (left-to-right dimension in FIG. 2) of a server 211. In various embodiments, the width 212 is in the range of 17.5 to 20.5 inches, and preferably about 19 inches.

The rack 202 further includes one or more bus regions 206, 208 configured to receive a modified PDU, described in greater detail below. In the illustrated embodiment, the first bus region 206 is bounded by the left wall panel 214 and a first outer wall 216; the second bus region 208 is bounded by the right wall panel 218 and a second outer wall 220. Each bus region thus exhibits a width dimension 224 which generally corresponds to the width of a PDU, while allowing some clearance to facilitate installation and removal of the PDU from the bus region. In various embodiments, the width 224 is in the range of 1 to 3 inches, and preferably about 1.75 inches.

In various embodiments, a bus region (e.g., 206, 208) may include a server side power connection module 234 configured to mate with a corresponding PDU side power connection module (not shown in FIG. 2), as described in greater detail below in conjunction with FIGS. 5, 7, 10, and 11. In addition, a bus region may include a mechanism 232 to facilitate the manual insertion and/or removal of the PDU from the bus region such as, for example, a pivot pin, ramp, slide, journal, notch, bearing, or the like.

With continued reference to FIG. 2, a power cable 234 supplies power from a connection 236 of a power supply 238 to the PDU via the server side power connection module 234, as generally described above in connection with FIG. 1.

Figure 3:
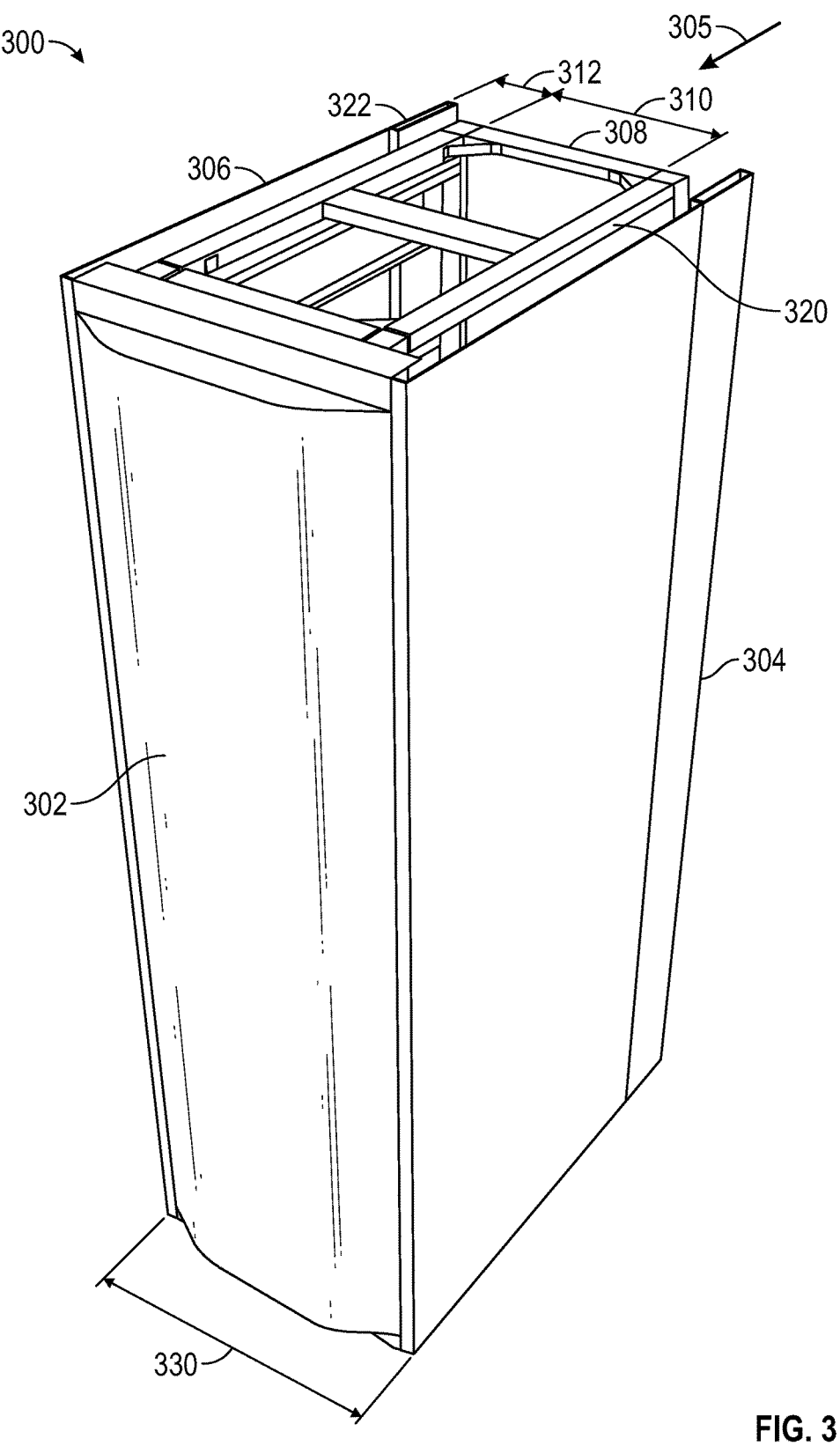
FIG. 3 is an isometric view of a server rack having an expanded frame to receive one or more rack mounted PDUs in accordance with various embodiments.

Referring now to FIG. 3, a server rack cabinet 300 includes a front panel 302, typically comprising a transparent door permitting visual inspection of the servers contained within the cabinet, a left outside wall 304 (when viewed from the rear of the cabinet along vector 305), a right outside wall 306, and a frame structure 308. The frame structure 308 preferable includes a server region defined by a first support member 320 and an oppositely disposed second support member 322 separated from the first support member by a width dimension 310 (generally analogous to dimension 212 in FIG. 2). One or more frame extensions define a corresponding bus region between a support member and an outside wall having a width dimension 312 (generally analogous to dimension 224 in FIG. 2). The outside walls 304, 306 are separated by a distance 330 (generally analogous to dimension 222 in FIG. 2).

Figure 4:
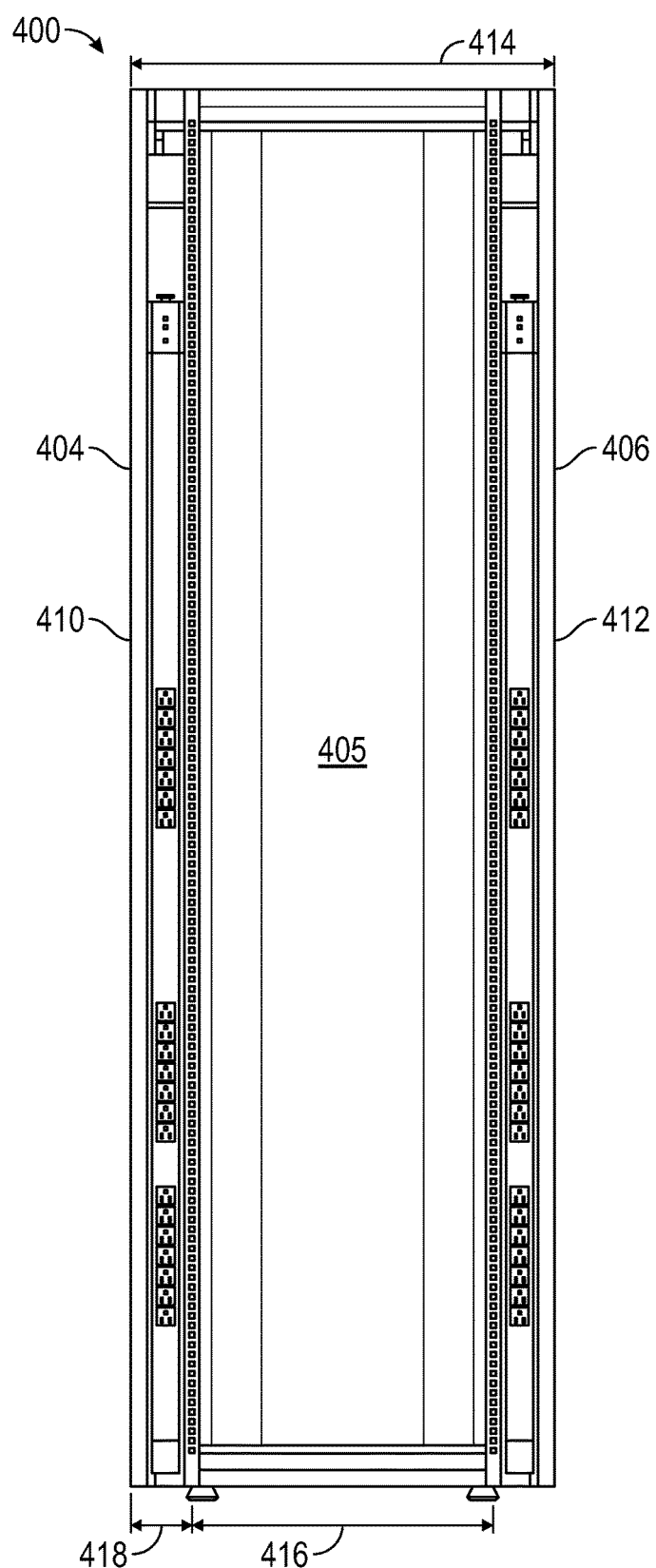
FIG. 4 is a rear elevation view of the server rack of FIG. 3 in accordance with various embodiments.

FIG. 4 is a rear view of a cabinet 400 taken along line 305 of FIG. 3. More particularly, the cabinet 400 includes outside walls 404, 406 separated by a distance 414 (generally analogous to dimensions 222 and 330), and respective frame members 410, 412 separated by a distance 416 (generally analogous to dimensions 212 and 310) and defining an interior server region 405. A bus enclosure is disposed between each frame member and it's adjacent outside wall, the bus enclosure having a width 418 (generally analogous to dimensions 224 and 312).

Figure 5:
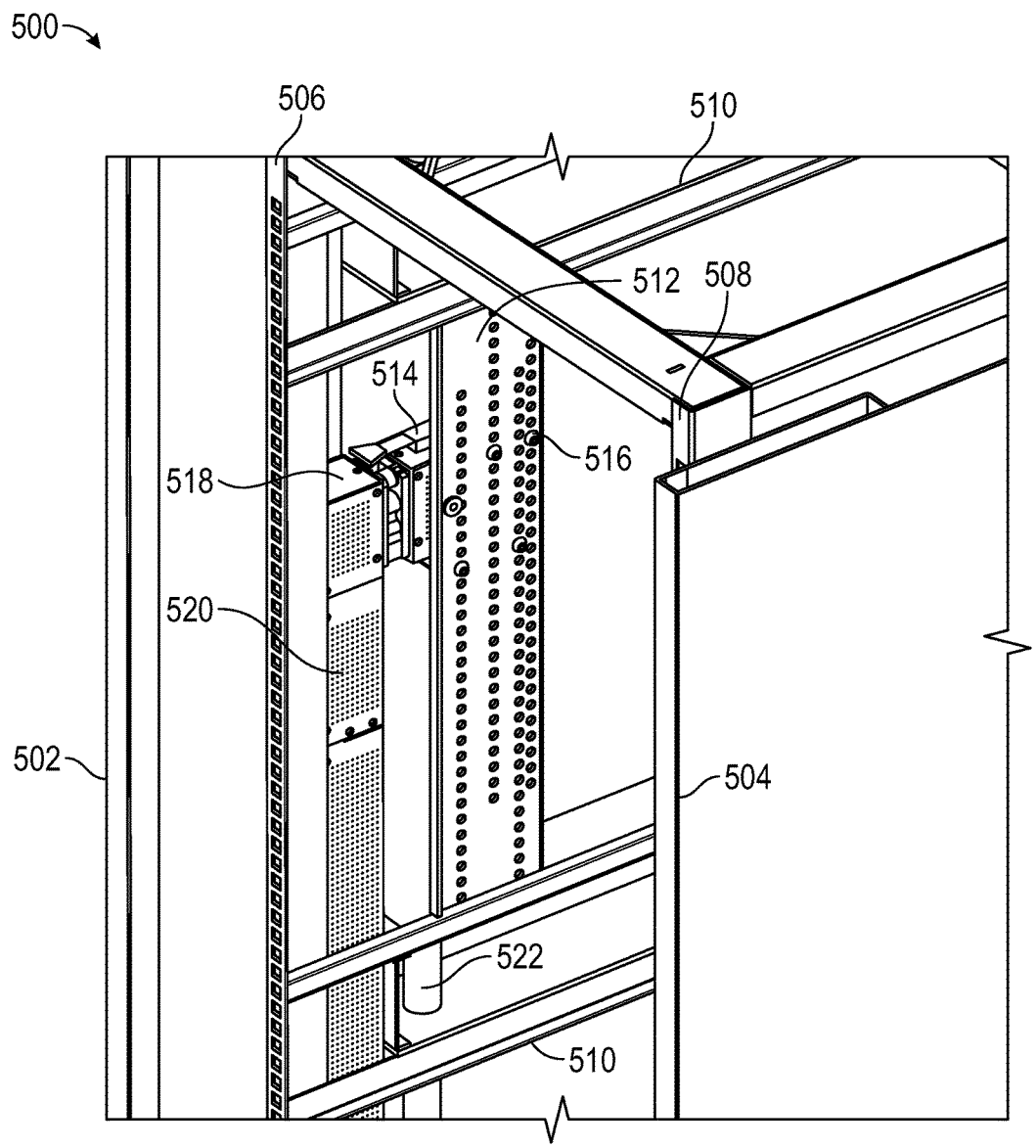
FIG. 5 is a perspective view of a server rack with a cordless PDU installed therein in accordance with various embodiments.

FIG. 5 is a perspective view of a server cabinet 500 with a cordless PDU 520 installed therein in accordance with various embodiments. In particular, the cabinet 500 includes respective outer wall panels 502, 504, respective server bracket members 506 and 508 having a plurality of guide rails 510 connected thereto and configured to support server and other network computing hardware (not shown in FIG. 5), a server connector module mounting plate 512, and a power cord conduit 522. A server connector module 514 is shown secured to the mounting plate 512 by fasteners 516. As shown, the mounting plate 512 extends between two vertically adjacent rails 510; alternatively, the mounting plate may be integrated into the outside wall panel.

A PDU connector module 518 is connected to the top end of the PDU 520, and mechanically and electrically coupled to the server connector module 514. A power cord (not shown in FIG. 5) extends from a UPS to the server connector module 514 via the conduit 522. Those skilled in the art will appreciate that the PDU 520 is disposed within a bus region of the cabinet, generally defined as the region between the server bracket member 506 and the left outside wall panel 502.

Figure 6:
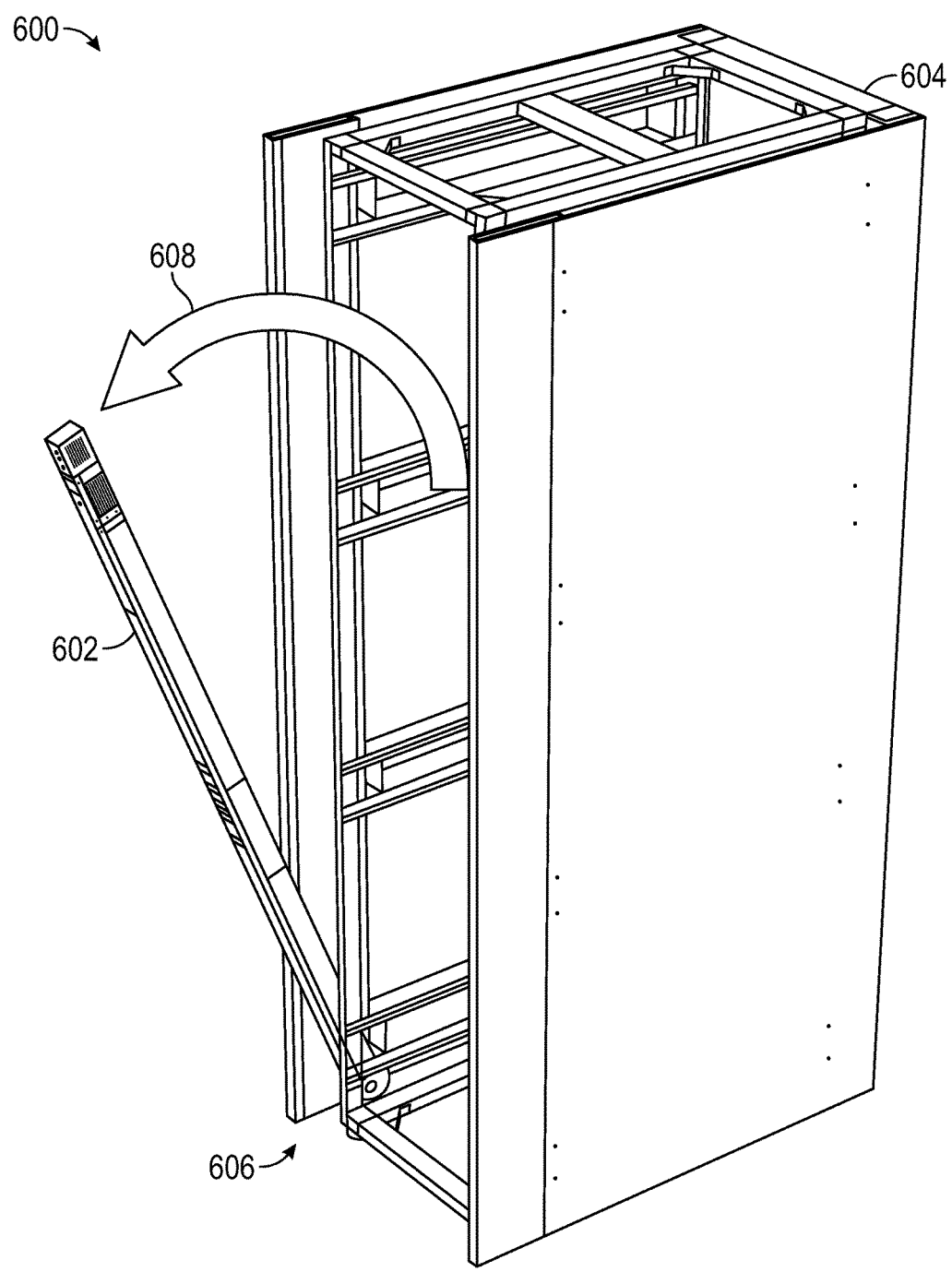
FIG. 6 is a perspective view of a PDU pivotably mounted within a server rack in accordance with various embodiments.

Referring now to FIGS. 6-12, the manner in which the PDU is installed into and removed from the cabinet will now be described in accordance with various embodiments of the present invention. More particularly, FIG. 6 illustrates a power distribution assembly 600 including a PDU 602 removably mounted within a server rack cabinet 604 in accordance with various embodiments. The PDU 602 and/or the cabinet 604 include an attachment mechanism 606 which, in the illustrated embodiment, facilitates rotation of the PDU about the attachment mechanism along an arc 608.

Figure 7:
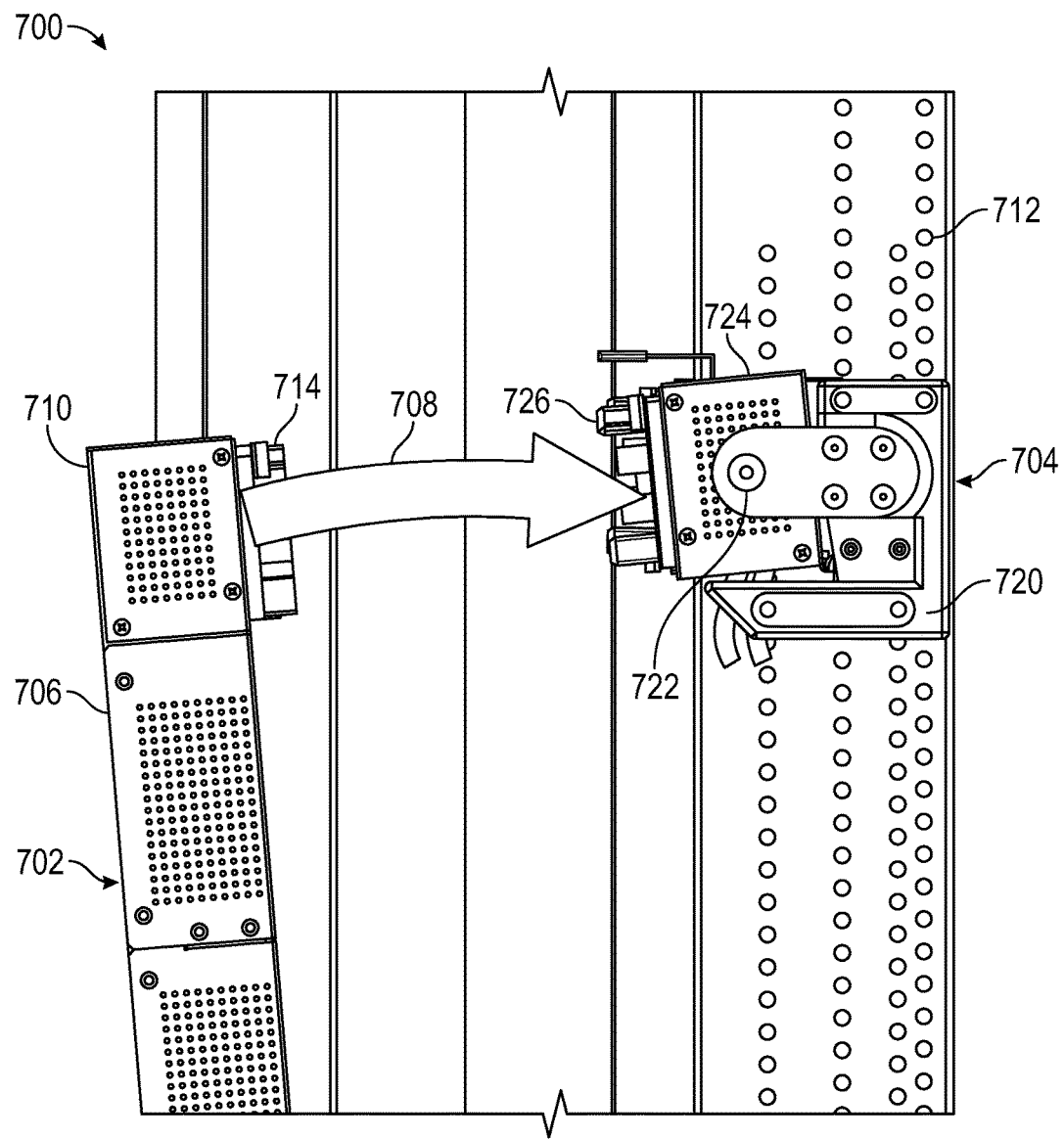
FIG. 7 is a schematic diagram illustrating the alignment and engagement of a PDU to its mating, rack mounted server side connector module in accordance with various embodiments

FIG. 7 details the alignment and engagement of a PDU to its mating, rack mounted power supply module in accordance with various embodiments. In particular, an exemplary power supply connection assembly 700 includes a PDU 702 and a supply module assembly 704. The PDU includes a body portion 706 and a PDU connector module 710 secured to one end (e.g., the top) of the PDU. The supply module assembly 704 comprises a server side connector module 724 and a mounting member 720 configured to secure the connector module 724 to a mounting panel 712. When the PDU connector module 710 is drawn along the arcuate path 708, a first electromechanical termination 714 associated with module 710 is brought into engagement with a second electromechanical termination 726 associated with the connector module 724. To facilitate this engagement as module 724 travels along an arcuate path, the connector module 724 is suitably configured to rotate about a pivot 722, and further configured to move (from left to right in FIG. 7) along a slide mechanism 720.

Figure 8:
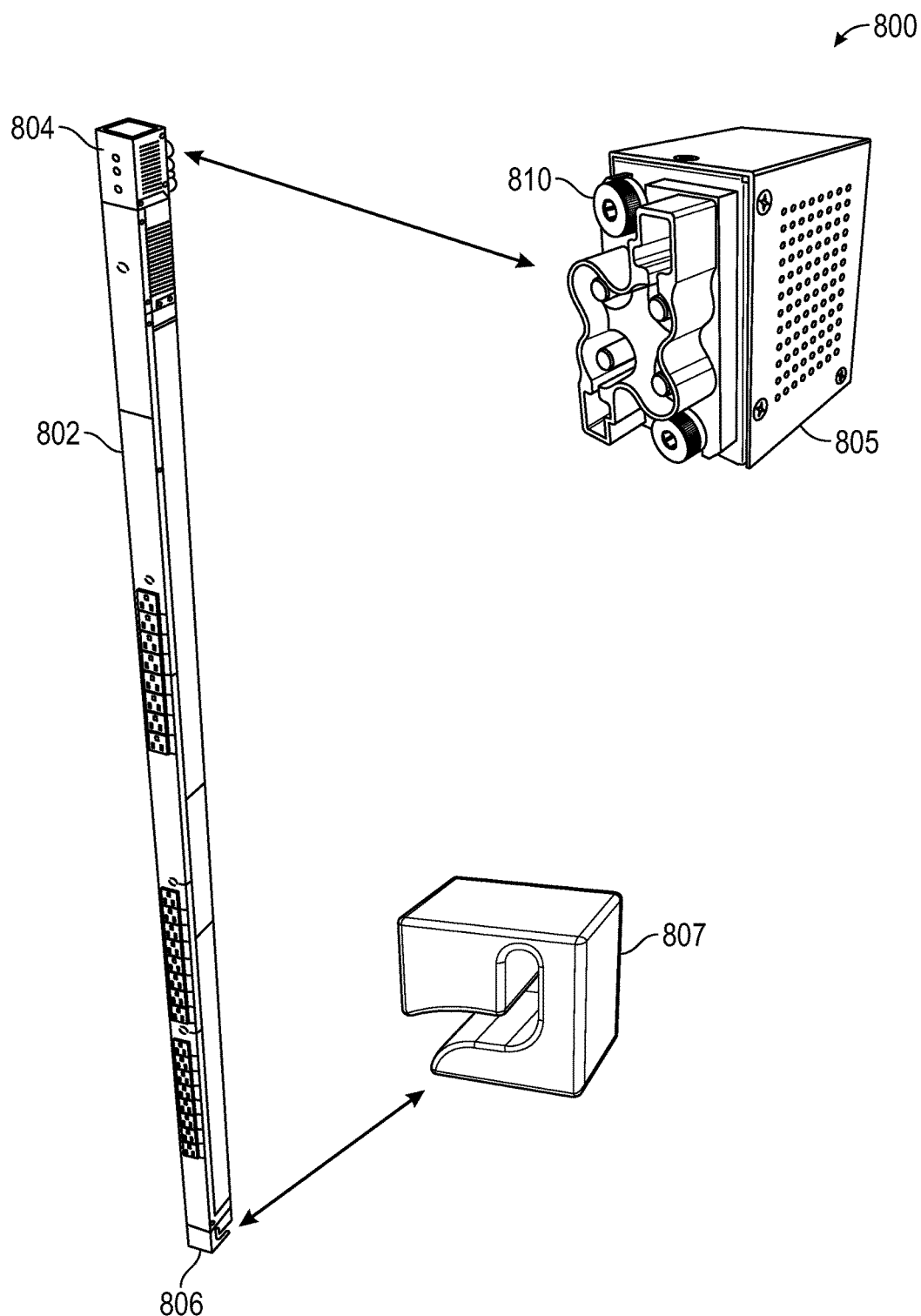
FIG. 8 is a perspective view of a modified PDU, including close up views of the PDU side connector mount and base pivot mount in accordance with various embodiments.

With reference to FIG. 8, an enhanced PDU 800 includes a body 802, a PDU side connector module 804 integrated into one end (e.g., the top) of the PDU, and a base mount 806 integrated into the opposite (e.g., the bottom) end of the PDU. A close up view 805 of the connector module depicts an exemplary electromechanical termination configuration comprising standard male fusion lugs configured to electromechanically engage corresponding female fusion lugs (not shown) associated with the server side connector module. A close up view 807 of the base mount depicts an exemplary pivot mount, described in greater detail below in connection with FIG. 9.

Figure 9:
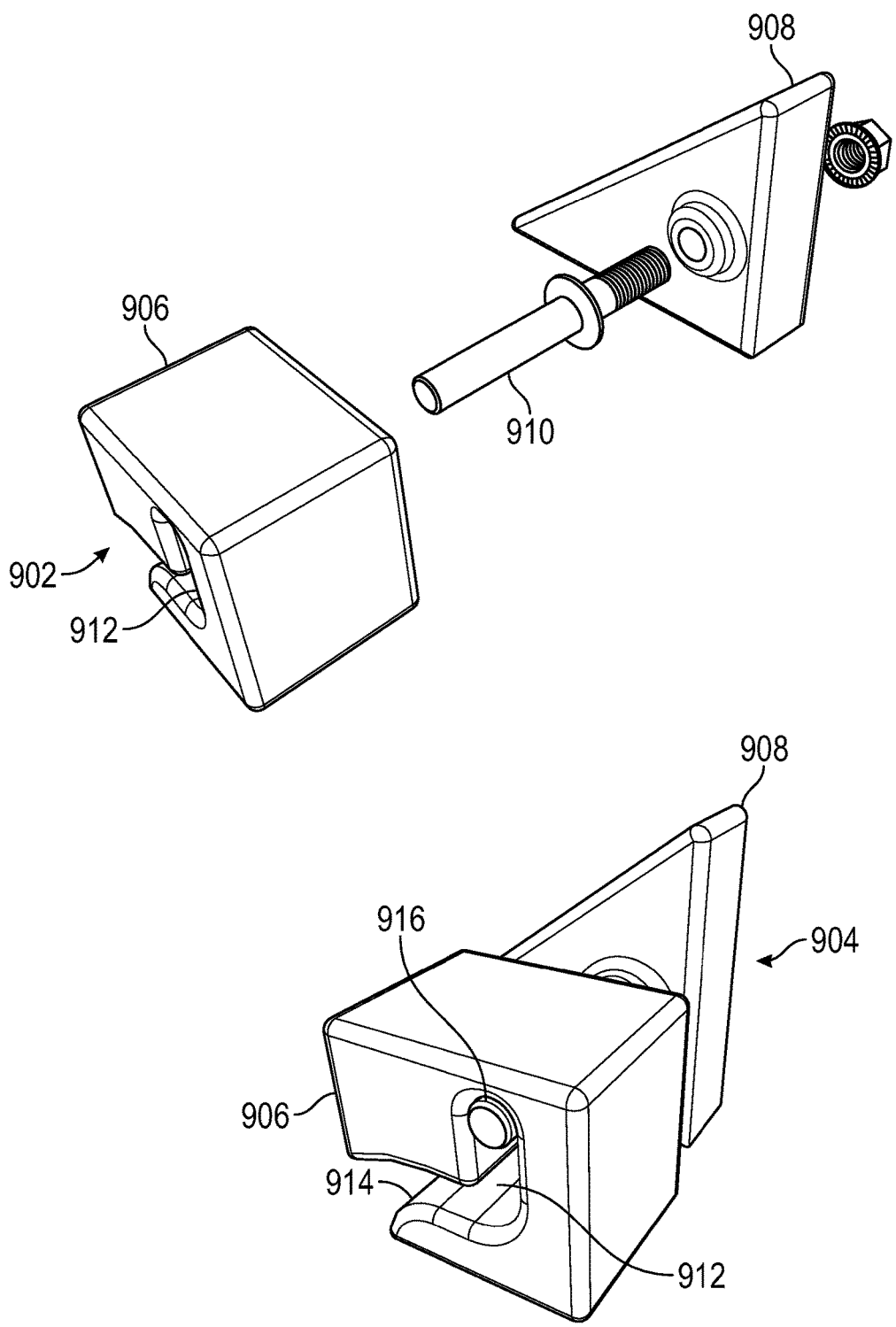
FIG. 9 is a detailed schematic view of the base pivot mount assembly of FIG. 8 in accordance with various embodiments.

FIG. 9 illustrates an exploded view 902 and an assembled view 904 of a base pivot mounting assembly including a base pivot mount 906, a shaft or dowell 910, and a journaled support member 908 attached to or otherwise integral with the cabinet frame. When installing the PDU into a bus region of a cabinet, the user manually guides the front opening 914 of a relief 912 into engagement with the stationary shaft 910, and urges the bottom of the forward (away from the user) and downwardly, guiding the shaft 910 into engagement with the top portion 916 of the relief 912. In this position, gravity retains the shaft 910 within the upper relief portion 916, allowing the user to pivot the PDU along arrow 708 (FIG. 7) and into engagement with the server side power supply module.

Figure 10:
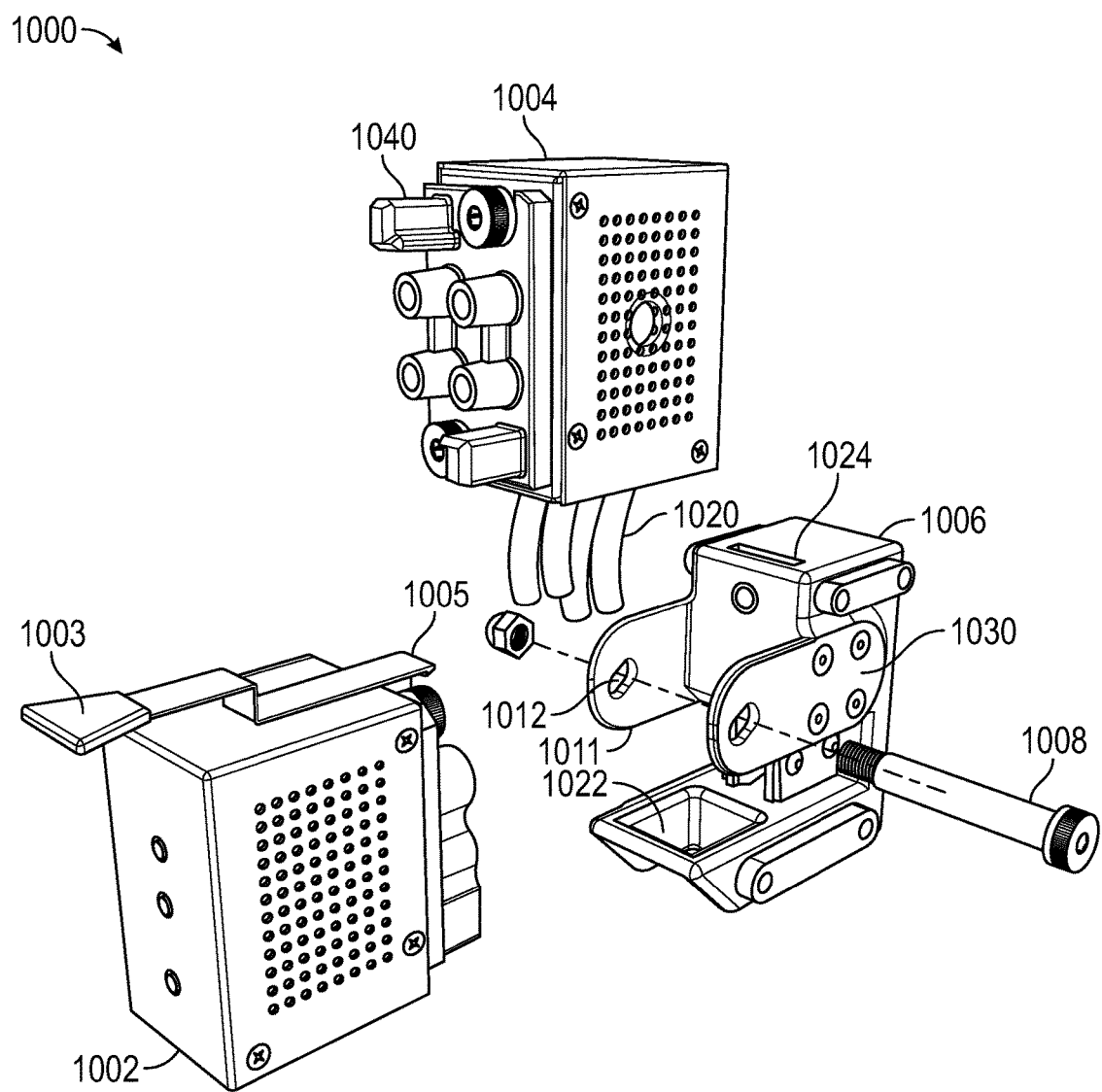
FIG. 10 is an exploded view of the PDU side connector mount and rack mounted server side connector module of FIGS. 5 and 7 in accordance with various embodiments.

Referring now to FIG. 10, a power supply connection module assembly 1000 includes a PDU side connector module 1002 including a first (e.g., male) engagement interface 1016, a server side connector module 1004 including a second, opposing (e.g., female) engagement interface 1040, and a frame mount 1006. In an embodiment, the frame mount 1006 includes a shaft 1008 and a shaft mount 1011 having a through hole 1012 for supporting the shaft 1008, a slide mechanism 1030, and a bundle guide 1022 through which a power supply/communication cable bundle 1020 connects to the server side connector module 1004. A locking mechanism 1003 attached to the PDU side connector module 1002 includes a tab 1005 configured to mate with a corresponding groove 1024 associated with the frame mount 1006 to releasably lock the mated assembly together, as described in greater detail below in connection with FIG. 11.

With continued reference to FIG. 10 and with momentary reference to FIG. 7, as the PDU side connector module 710, 1002 is manually maneuvered upwardly and to the right, the pivot assembly (e.g., shaft 1008 and shaft mount 1011) and slide mechanism 1030 allow the server side connector module 1004 to track this movement and facilitate the engagement between the first and second engagement interfaces 1016, 1040.

Figure 11:
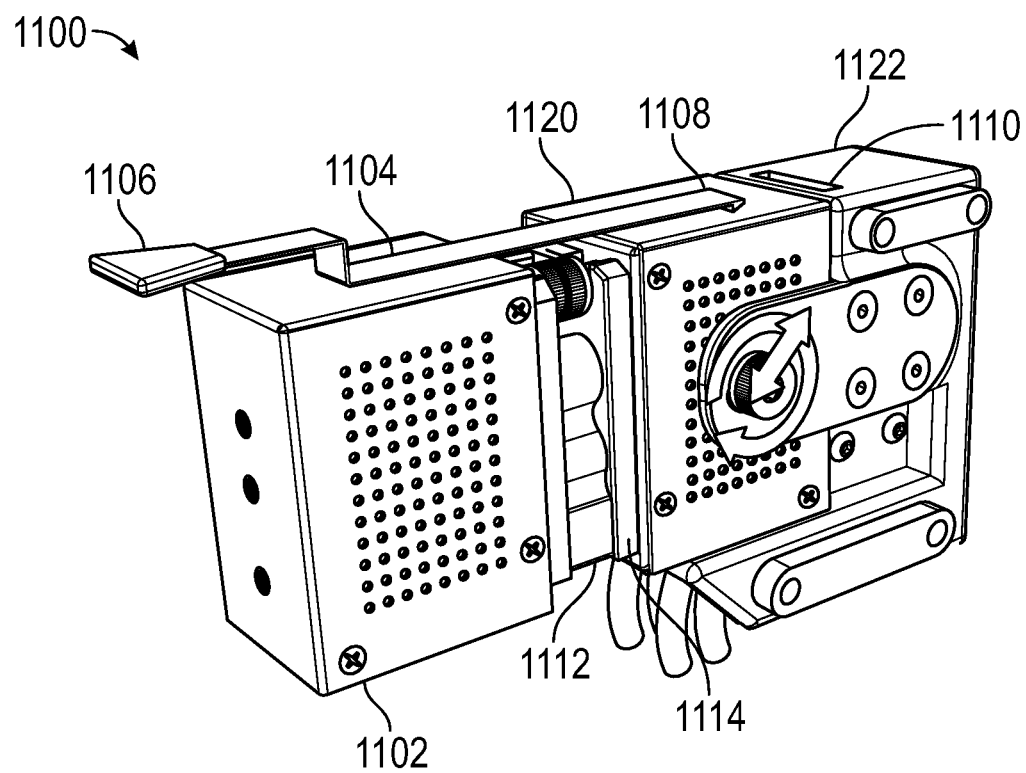
FIG. 11 is a perspective view of components of FIG. 10, shown in the engaged (installed) position in accordance with various embodiments.

FIG. 11 is a perspective view of the components depicted in FIG. 10, shown in the engaged (installed) position in accordance with various embodiments. More particularly, power supply connection module assembly 1100 includes a PDU side connector module 1102 including a first (e.g., male) engagement interface 1112, a server side connector module 1120 including a second, opposing (e.g., female) engagement interface 1114, and a frame mount 1122. The PDU connector module 1102 further includes a locking mechanism 1104 including a handle 1106 and locking tab 1108 which, when the two modules are fully engaged, seats within a recessed groove or against a raised detent 1110 on the top surface of the frame mount 1122 to thereby maintain locked engagement between the opposing modules until manually released by manipulating the 1106.

Figure 12:
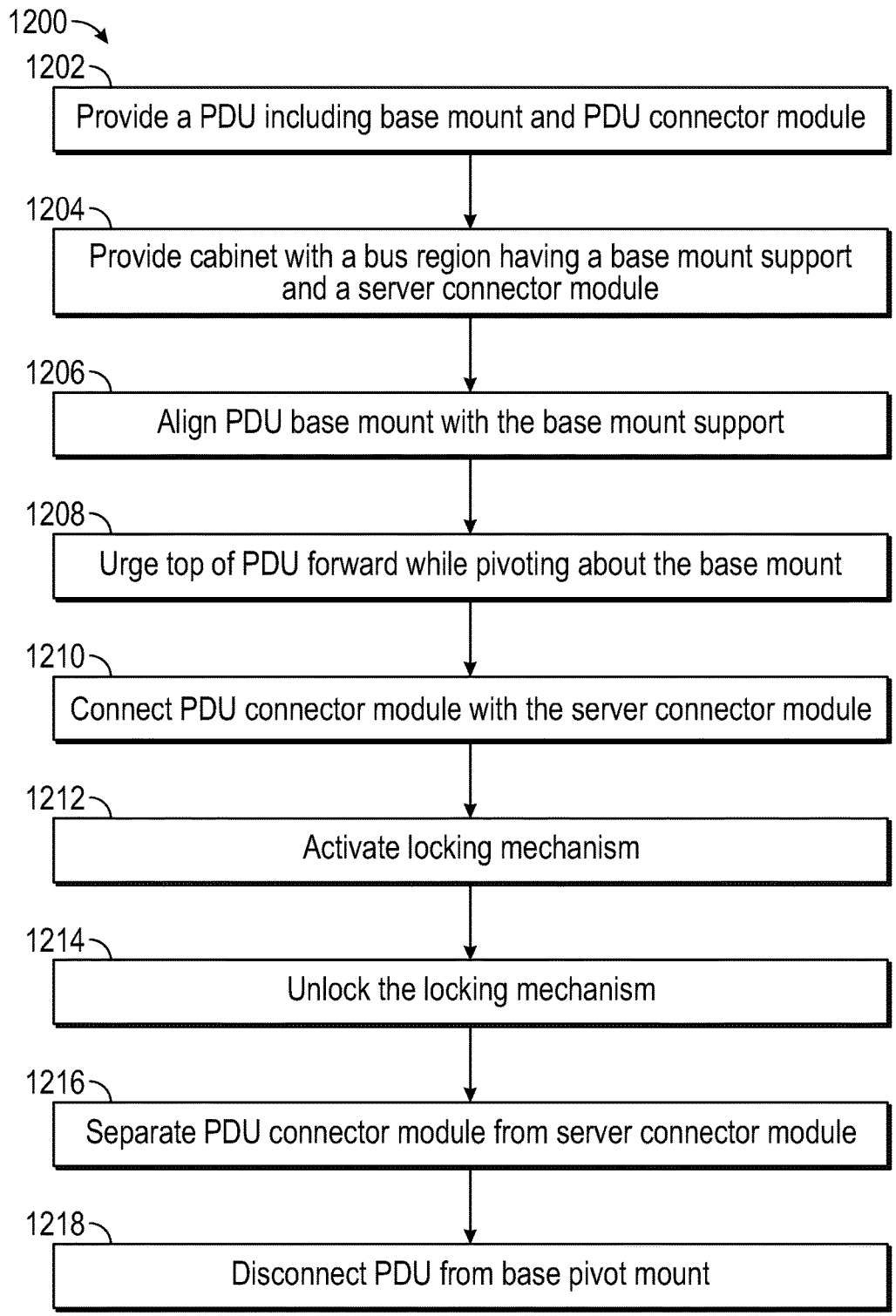
FIG. 12 is a flow chart illustrating a method for installing a PDU into a server rack in accordance with various embodiments.

FIG. 12 is a flow chart illustrating an exemplary method 1200 for installing and removing a PDU from a server rack cabinet in accordance with various embodiments. The method 1200 includes providing an enhanced PDU with a base mount and a PDU connector module (Task 1202), and providing an extended cabinet with a bus region having a base mount support and a server connector module (Task 1204). The PDU base mount is then (e.g., manually) manipulated into alignment with, onto, or otherwise into contact with the base mount support (Task 1206). The top portion of the PDU may then be urged forward (toward the cabinet), pivoting about the base mount (Task 1208) until the PDU connector module connects with the server connector module (Task 1210). In various embodiments, a locking mechanism may be activated (Task 1212) to prevent the PDU connector module from unintended disconnection from the server connector module.

With continued reference to FIG. 12, removing the PDU from the cabinet involved unlocking the locking mechanism (Task 1214), for example, by disengaging the tab from the groove or otherwise releasing the lock, and separating the PDU connector module from the server connector module (Task 1216). The PDU may then be unhinged or otherwise disconnected from the base pivot mount (Task 1218), thereby allowing the PDU to be removed from the cabinet.

An elongated power distribution unit (PDU) is thus provided for use in a rack mounted server cabinet of the type including a power bus region having a base mount support and a server connector module. The PDU includes: a plurality of electrical outlets configured to supply power to a plurality of computing devices; a PDU connector module proximate a first end of the PDU and configured for releasable engagement with the server connector module; and a base mount proximate a second end of the PDU and configured to articulate about the base mount support.

In an embodiment, the base mount support comprises a fixed shaft, and the base mount comprises a relief configured to removably engage the shaft; the base mount may also be configured to permit the PDU to pivot about the shaft.

In an embodiment, the PDU further includes at least one network communication port configured to communication with one of the computing devices.

In an embodiment, the server connector module includes a first electromechanical interface, and the PDU connector module comprises a second electromechanical interface configured for releasable engagement with the first electromechanical interface.

In an embodiment, the second electromechanical interface comprises a fusion lug interface.

In an embodiment, the PDU further includes a first locking component configured to selectively maintain engagement between the PDU connector module and the server connector module.

In an embodiment, the cabinet includes a second locking component configured to releasably engage the first locking component.

In an embodiment, the first locking component includes a handle and a spring loaded tab, and the second locking component comprises a grove configured to releasable receive the tab.

In an embodiment, one of the base mound and the base mount support comprises a serpentine path for engaging a shaft to thereby permit the PDU to pivot about the shaft.

In an embodiment, the PDU further includes internal wiring configured to supply power from the PDU connector module to the plurality of electrical outlets.

A server cabinet having an integral bus region is also provided for receiving a PDU of the type having a base mount and a PDU connector module. The cabinet includes: a rack region having a left frame member and a right frame member, each bearing a plurality of rail pairs for supporting a plurality of respective computer devices; an elongated bus region disposed between one of the frame members and an outside frame member; a base mount support disposed in a lower portion of the bus region; and a server connector module configured to releasable engage the PDU connector module.

In an embodiment, each rail pair is separated by a distance in the range of 17.5 to 20.5 inches, and preferably about 19 inches.

In an embodiment, the outside frame member and the frame member comprising the bus region are separated by a distance in the range of 1.5 to 1.75 inches.

In an embodiment, the bus region further includes a frame mount module configured to pivotably support the server connector module.

In an embodiment, the frame mount module is configured to pivot and slide to accommodate arcuate motion of the PDU during engagement between the server connector module and the PDU connector module.

In an embodiment, the PDU connector module comprises a first locking component; at least one of the server connector module and the frame mount module comprises a second locking component; and the first locking component and the second locking component are configured to releasable lock the PDU connector module into electromechanical engagement with the server connector module.

A power distribution system is also provided for use with rack mounted computer devices, the power distribution system including a cabinet and a PDU configured for receipt within the bus region. The cabinet includes: a rack region having a plurality of rail pairs for supporting a plurality of computer devices; and a bus region having a base mount support and a server connector module. The PDU includes: a plurality of electrical outlets configured to supply power to the computing devices; a PDU connector configured for releasable engagement with the server connector module; and a base mount configured to permit the PDU to pivot about the base mount support.

In an embodiment, the PDU further includes a first locking component and the cabinet comprises a second locking component configured to releasably engage the first locking component to selectively maintain engagement between the PDU connector module and the server connector module.

In an embodiment, the server connector module includes a first electromechanical interface, and the PDU connector module comprises a second electromechanical interface configured for releasable engagement with the first electromechanical interface While there has been illustrated an enabling description of various embodiments including the best mode known to the inventors, it will be understood by those skilled in the art that various changes and modifications may be made and equivalents may be substituted for various elements without departing from the scope of the invention. Therefore, it is intended that the inventions disclosed herein not be limited to the particular embodiments disclosed, but that the invention will include all embodiments falling within the literal and equivalent scope of the appended claims.

I claim:

1. An elongated power distribution unit (PDU) for use in a rack mounted server cabinet of a type including a power bus region having a base mount support and a server connector module, the server connector module having a first electromechanical interface, the PDU comprising:
    a plurality of electrical outlets configured to supply power to a plurality of computing devices;
    a PDU connector module proximate a first end of the PDU and configured for releasable engagement with the server connector module, the PDU connector module comprises a second electromechanical interface configured for releasable engagement with the first electromechanical interface, the second electromechanical interface providing mechanical and electrical coupling to the first electromechanical interface; and
    a base mount proximate a second end of the PDU and configured to articulate about the base mount support.

2. The PDU of claim 1, wherein the base mount support comprises a fixed shaft, and the base mount comprises a relief configured to removably engage the shaft.

3. The PDU of claim 2, wherein the base mount is configured to permit the PDU to pivot about the shaft.

4. The PDU of claim 1, further comprising at least one network communication port configured to communication with one of the computing devices.

5. The PDU of claim 1, wherein the second electromechanical interface comprises a fusion lug interface.

6. The PDU of claim 1, further comprising a first locking component configured to selectively maintain engagement between the PDU connector module and the server connector module.

7. The PDU of claim 6, wherein the cabinet comprises a second locking component configured to releasably engage the first locking component.

8. The PDU of claim 7, wherein the first locking component comprises a handle and a spring loaded tab, and the second locking component comprises a groove configured to releasable receive the tab.

9. The PDU of claim 1, wherein one of the base mount and the base mount support comprises a serpentine path for engaging a shaft to thereby permit the PDU to pivot about the shaft.

10. The PDU of claim 1, further comprising internal wiring configured to supply power from the PDU connector module to the plurality of electrical outlets.

11. A server cabinet having an integral bus region for receiving a PDU of the type having a base mount, a plurality of electrical and a PDU connector module, the PDU connector module including a first electromechanical interface, the server cabinet comprising:
- a rack region having a left frame member and a right frame member, each bearing a plurality of rail pairs for supporting a plurality of respective computer devices;
- an elongated bus region disposed between one of the left and right frame members and an outside frame member;
- a base mount support disposed in a lower portion of the bus region and configured to allow for the base support to articulate about the base mount support; and
- a server connector module configured to releasable engage the PDU connector module, the server connector module comprises a second electromechanical interface configured for releasable engagement with the first electromechanical interface, the second electromechanical interface providing mechanically and electrically coupling to the first electromechanical interface.

12. The server cabinet of claim 11, wherein each of the plurality of rail pairs is separated by a distance in a range of 17.5 to 20.5 inches.

13. The server cabinet of claim 11, wherein the outside frame member and one of the left an right frame members comprising the bus region are separated by a distance in a range of 1.5 to 1.75 inches.

14. The sever cabinet of claim 11, wherein the bus region further comprises a frame mount module configured to pivotably support the sever connector module.

15. The server cabinet of claim 14, wherein the frame mount module is configured to pivot and slide to accommodate arcuate motion of the PDU during engagement between the second electromechanical interface of the server connector module and the first the electromechanical interface of the PDU connector module.

16. The server cabinet of claim 14, wherein: the PDU connector module comprises a first locking component; and at least one of the server connector module and the frame mount module comprises a second locking component; and wherein the first locking component and the second locking component are configured to releasable lock the first electromechanical interface of the PDU connector module into electromechanical engagement with the first electromechanical interface of the server connector module.

17. A power distribution system for use with rack mounter computer devices, comprising:
- a cabinet including:
  - a rack region having a plurality of rail pairs for supporting a plurality of computer devices;
  - a bus region having a base mount support and a server connector module, the server connector module comprises a first electromechanical interface; and
- a PDU configured for receipt within the bus region, the PDU comprising:
  - a plurality of electrical outlets configured to supply power to the computer devices;
  - a PDU connector comprises a second electromechanical interface configured for releasable engagement with the first electromechanical interface of the server connector module, the second electromechanical interface providing mechanical and electrical coupling to the first electromechanical interface; and
  - a base mount configured to permit the PDU to pivot about the base mount support.

18. The power distribution system of claim 17, wherein the PDU further comprises a first locking component and the cabinet comprises a second locking component configured to releasably engage the first locking component to selectively maintain engagement between the PDU connector module and the server connector module.

* * * * *